US011061065B2

(12) United States Patent
Weindel et al.

(10) Patent No.: US 11,061,065 B2
(45) Date of Patent: Jul. 13, 2021

(54) TESTING DEVICE AND METHOD FOR TESTING A PRINTED CIRCUIT BOARD

(71) Applicant: Xcerra Corp., Norwood, MA (US)

(72) Inventors: Christian Weindel, Ölbronn-Dürrn (DE); Bernd-Ulrich Ott, Künzelsau (DE); Peter Brandt, Würzburg (DE)

(73) Assignee: Xcerra Corp., Norwood, MA (US)

( * ) Notice: Subject to any disclaimer, the term of this patent is extended or adjusted under 35 U.S.C. 154(b) by 34 days.

(21) Appl. No.: 16/484,674

(22) PCT Filed: Feb. 9, 2018

(86) PCT No.: PCT/EP2018/053236
§ 371 (c)(1),
(2) Date: Aug. 8, 2019

(87) PCT Pub. No.: WO2018/146234
PCT Pub. Date: Aug. 16, 2018

(65) Prior Publication Data
US 2020/0011924 A1 Jan. 9, 2020

(30) Foreign Application Priority Data
Feb. 10, 2017 (DE) ............ 10 2017 102 700.9

(51) Int. Cl.
*G01R 31/28* (2006.01)
*G01R 1/073* (2006.01)

(52) U.S. Cl.
CPC ..... *G01R 31/2808* (2013.01); *G01R 1/07328* (2013.01)

(58) Field of Classification Search
CPC ............ G01R 31/2808; G01R 1/07328; G01R 1/07335
See application file for complete search history.

(56) References Cited

U.S. PATENT DOCUMENTS 3,980,553 A * 9/1976 Quinn .................... B07C 5/344
209/565
5,680,936 A 10/1997 Beers
(Continued)

FOREIGN PATENT DOCUMENTS

CN 101198879 A 6/2008
CN 105842606 8/2016
(Continued)

OTHER PUBLICATIONS

International Preliminary Report on Patentability, dated Aug. 13, 2019, from International Application No. PCT/EP2018/053236, filed on Feb. 9, 2018. 21 pages.
(Continued)

*Primary Examiner* — Patrick Assouad
*Assistant Examiner* — Demetrius R Pretlow
(74) *Attorney, Agent, or Firm* — HoustonHogle LLP

(57) ABSTRACT

The present invention relates to a testing device and to a method for testing circuit boards, in particular un-equipped or partially-equipped circuit boards. The testing device is a flying probe with a shuttle or two sub-shuttles, which can displace a circuit board to be tested to a test area in an alternating manner. In addition, the sub-shuttles can be used for commonly holding a large circuit board.

17 Claims, 10 Drawing Sheets

(56) References Cited

U.S. PATENT DOCUMENTS

Figure 1:
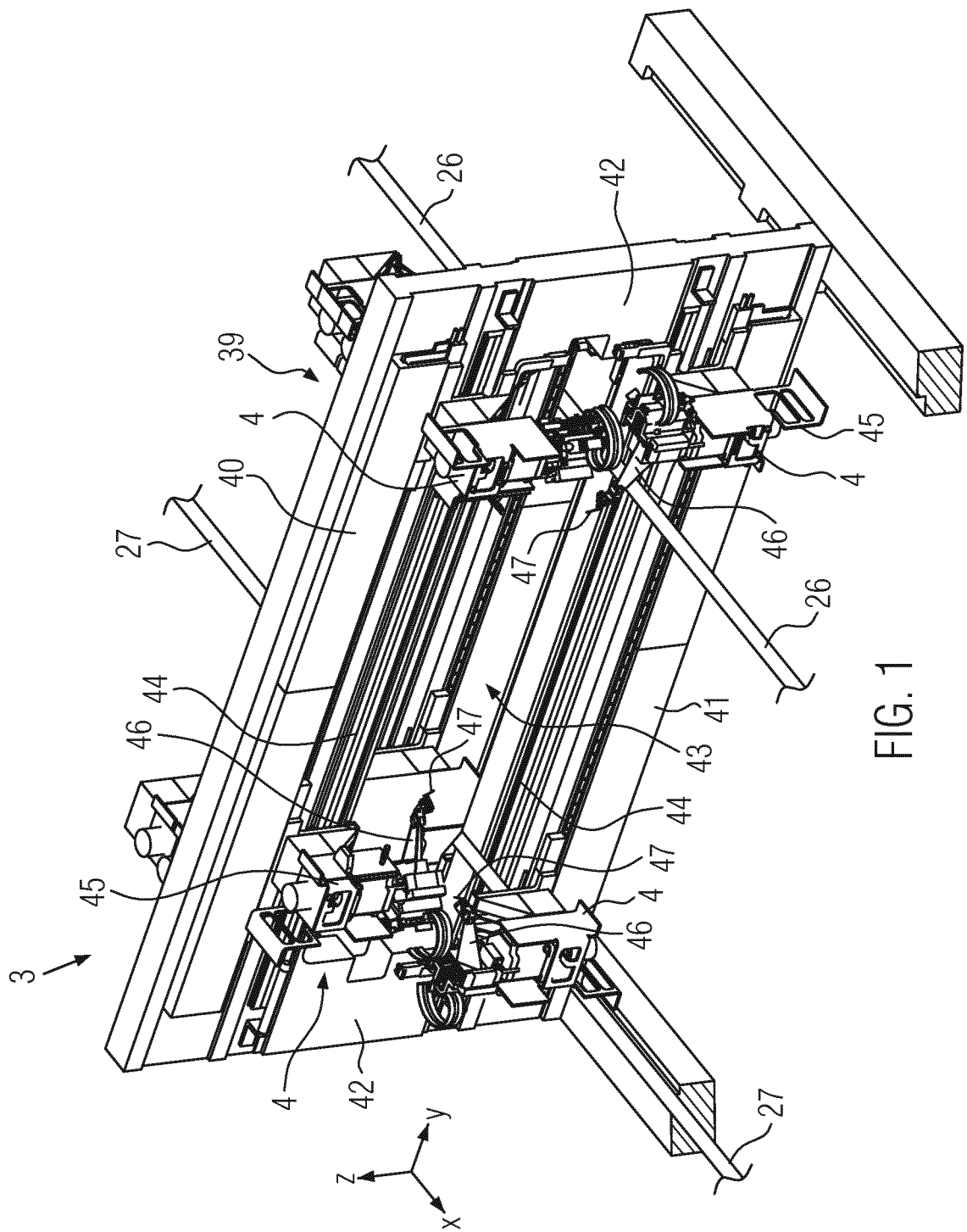

| | | | | |
|---|---|---|---|---|
| 5,818,246 A * | 10/1998 | Zhong | | G01R 1/07328 324/750.19 |
| 5,818,248 A * | 10/1998 | St. Onge | | G01R 1/07328 324/750.25 |
| 5,903,160 A * | 5/1999 | Ianenko | | G01R 31/2805 324/537 |
| 6,037,764 A * | 3/2000 | Smith | | G01R 31/2887 324/756.01 |
| 6,218,852 B1 * | 4/2001 | Smith | | G01R 31/2806 324/757.02 |
| 6,300,584 B1 * | 10/2001 | Song | | H01L 21/67271 209/509 |
| 6,384,614 B1 | 5/2002 | Hager et al. | | |
| 6,384,641 B1 | 5/2002 | Kase | | |
| 6,445,977 B1 * | 9/2002 | Hwang | | G01R 31/2808 198/345.1 |
| 6,501,156 B1 | 12/2002 | Nakanishi et al. | | |
| 7,256,596 B1 * | 8/2007 | Russell | | G01R 31/2808 324/750.22 |
| 9,110,129 B1 * | 8/2015 | Ames | | G01R 1/07328 |
| 2002/0013667 A1 * | 1/2002 | Zemer | | G01R 31/2887 702/57 |
| 2002/0062553 A1 | 5/2002 | Hwang et al. | | |
| 2003/0020504 A1 * | 1/2003 | Abdulky | | G01R 31/2808 324/754.03 |
| 2003/0020506 A1 * | 1/2003 | Prokopp | | G01R 1/07335 324/750.25 |
| 2004/0060170 A1 | 4/2004 | Gieskes | | |
| 2004/0143411 A1 * | 7/2004 | Wu | | G01R 31/01 702/117 |
| 2005/0197797 A1 | 9/2005 | Dowland et al. | | |
| 2008/0272792 A1 * | 11/2008 | Romanov | | G01R 31/2805 324/754.19 |
| 2009/0295053 A1 | 12/2009 | Farlow et al. | | |
| 2010/0271058 A1 * | 10/2010 | Kitai | | G01R 31/2806 324/750.19 |
| 2014/0266276 A1 * | 9/2014 | Romanov | | G01R 31/2808 324/750.25 |
| 2016/0084904 A1 | 3/2016 | Choi et al. | | |
| 2018/0217200 A1 * | 8/2018 | Dehmel | | G01R 31/2808 |

FOREIGN PATENT DOCUMENTS

| | | |
|---|---|---|
| DE | 4441347 | 5/1996 |
| DE | 20005123 | 8/2001 |
| DE | 102015113046 | 2/2017 |
| EP | 0458280 | 5/1991 |
| EP | 0468153 | 1/1992 |
| EP | 0853242 | 7/1998 |
| EP | 0990912 | 4/2000 |
| EP | 1186898 | 3/2002 |
| EP | 1185156 | 6/2002 |
| EP | 1217382 | 6/2002 |
| EP | 1451594 | 6/2003 |
| JP | 11-183864 A | 7/1999 |
| JP | 2009-168601 | 7/2009 |
| JP | 2016-511410 | 4/2016 |
| KR | 101178416 | 8/2012 |
| KR | 10-2015-0127697 A | 12/2016 |
| TW | 399323 | 3/2011 |
| WO | WO03096037 | 11/2003 |
| WO | WO2006133808 | 12/2006 |
| WO | WO2012157950 | 11/2012 |
| WO | WO2014140029 | 9/2014 |
| WO | WO2015070135 | 5/2015 |
| WO | WO 2015070135 | 5/2015 |

OTHER PUBLICATIONS

Bennett, Paul, "Flying Probe Testing Overview" Jan. 24, 2012. https:jjwww.smta.orgjchapters/files/Arizona-Sonora SMTA Presentation Nov13.pdf.

"Eurocircuits—New ATG flying probe testers installed," Youtube. Dec. 10, 2016 (Dec. 10, 2016). p. 1 pp .URL:https:jjwww.youtube.comjwatch?v=cvCFYeQaiWg.

Nexlogic: "Flying Probe Testing," You Tube (2008). p. 1. URL:https:jjwww.youtube.comjwatch?v=UHUv1FdlldU.

International Search Report of the International Searching Authority, dated Jun. 12, 2019, from International Application No. PCT/EP2018/053236, filed on Feb. 9, 2018. 12 pages.

Written Opinion of the International Searching Authority, dated Jun. 12, 2019, from International Application No. PCT/EP2018/053236, filed on Feb. 9, 2018. 12 pages.

Shiranee Spea: IIa new era of flying probe 1-25 testing. New technology. New performance. Faster test, May 25, 2011 (May 25, 2011). http://opcdn.net/file/M_701/W_137/uploads/file/Flying%20Probe%20Range%20-%20Leaflet%20-%20V5.pdf.

Chinese First Office Action dated Mar. 11, 2021 for Chinese Patent Application No. 201880015627.0. 29 pages.

* cited by examiner

TESTING DEVICE AND METHOD FOR TESTING A PRINTED CIRCUIT BOARD

RELATED APPLICATIONS

This application is a § 371 National Phase Application of International Application No. PCT/EP2018/053236, filed on Feb. 9, 2018, now International Publication No. WO 2018/146234, published on Aug. 16, 2018, which International Application claims priority to German Application 10 2017 102 700.9, filed on Feb. 10, 2017, both of which are incorporated herein by reference in their entirety.

The present invention relates to a testing device and to a method for testing circuit boards.

Testing devices for testing circuit boards can generally be classified into two groups, the group of flying probes and the group of parallel testing devices. Parallel testing devices are testing devices which contact all or at least most of the contact points of a circuit board to be tested at the same time by means of an adapter. Flying probes are testing devices for the testing of unequipped, partially-equipped or equipped circuit boards, scanning the individual contact points by means of two or more test fingers.

The test fingers are usually fastened to a carriage, which can be displaced along traverses, wherein the traverses are per se in turn guided and displaceable along guide rails. The test fingers each comprise a pivot arm, having a contact tip for contacting a circuit board at the end thereof. The test fingers, with their contact tips, can thus be positioned at any location of a usually rectangular testing field by displacing the carriage and rotating the pivot arm. For contacting a contact point of a circuit board to be tested, either the carriage is configured to be vertically-displaceable on the traverse, or the testing probe is configured to be vertically-movable on the carriage, so that the test finger can be placed on to the contact point of the circuit board, the circuit board testing point, from above or from below, respectively.

A flying probe is described in EP 0 468 153 A1, and a method for the testing of circuit boards by means of a flying probe is described in EP 0 853 242 A1. Testing probes for flying probes are disclosed in EP 1 451 594 B1, U.S. Pat. No. 6,384,641 B1, WO 03/096037 A1 and EP 0 990 912 A2.

Conventionally, at least two displaceable contact fingers are provided for such a flying probe in order to allow reaching testing points spaced from one another along the traverse axis in a first coordinate direction, and multiple traverses are provided above the testing field and (at least for the testing of circuit boards printed on both sides) multiple traverses are provided below the testing field in order to allow reaching testing points spaced from one another along the traverse axis in a second coordinate direction transversely to the traverse axis. In principle, the conductor path can be tested using merely one test finger when measuring capacitively. Theoretically, in this case, merely one test finger would be required. It is preferred, however, to arrange two test fingers on the track, as an ohmic measurement requires a closed circuit, and therefore requires two test fingers. The essential factor for the use of automated testing methods with a flying probe is that the positions of the traverses relative to one another and relative to the testing field are known exactly. In the flying probe described in EP 0 468 153 A1, the traverses are mounted displaceably in a frame—perpendicular with respect to the displacement direction of the test fingers. Due to a clearance when displacing the traverses, which cannot be avoided in many cases, the distance of the traverses has a certain range of tolerance and, depending on the drive system used, the distance of the traverses goes out of a certain range of tolerance and must be readjusted due to slip events. The involved adjustment and calibration processes for at least four traverses are elaborate and frequently result in imprecisions.

Moreover, flying probes in which the traverses are arranged stationary in a frame are known. As the traverses are suspended individually on a frame both above and below the circuit board, they must be adjusted individually and carefully. A length of the pivot arms can be optimized in terms of the distance between the traverses to be able to reach the testing field between the traverses in an optimum manner. If such a flying probe is to be adapted or adjusted to altered process conditions, e.g. because the scanning density is to be increased or reduced, additional traverses are to be mounted or existing traverses are to be removed or re-arranged. This requires considerable effort for the adjustment of the traverses relative to one another and to the testing field, and calibration of the software is required.

EP 0 458 280 A2 discloses a device for the testing of circuit boards, which comprises a plurality of separately-displaceable traverses, wherein a test head with a contact finger for contacting a contact point of a circuit board is provided on each traverse.

EP 1 217 382 A2 discloses a further device for the testing of circuit boards, which comprises displaceable traverses. The displaceable traverses each have a test head movably arranged thereon, on which a contact finger for contacting a test point of a circuit board is arranged.

Due to the fact that high-frequency-signals are also transmitted via the conductor paths of circuit boards, the advancing miniaturization of circuit boards results in considerable problems. In order to be able to correctly transmit a high-frequency signal through a conductor path, the conductor path must not have an excessive electrical resistance. The resistance of conductor paths must typically be smaller than or equal to a predetermined resistance, which can be in a range of 1μΩ to 100Ω. However, observing this resistance value can not always be ensured in the production of circuit boards.

Even conductor paths having a high current applied thereto during operation should not have regions of high resistance, in particular a resistance of 1 μΩ to 100Ω, since in such a resistance, a voltage would drop, which might result in a damage of the conductor path.

When testing such conductor paths, four-wire sensing is performed. To that end, a plying probe has testing probes with two testing tips provided on the test fingers. The conductor path to be examined is contacted on two circuit board testing points with in each case one such testing probe, wherein a current is fed into the conductor path via a respective one of the testing tips, and the voltage dropping at the conductor path is measured via the other testing tip of the testing probe. This allows detecting resistances in the range of less than or equal to 1 μΩ to 100Ω in a highly-reliable manner.

Due to the increasing miniaturization of circuit boards and downsizing of the circuit board testing points, it is difficult to contact a circuit board testing point correctly using such a double-tip, i.e. both tips of the testing probe are in electrical contact with the circuit board testing point.

Another flying probe is disclosed in WO 2014/140029 A1, comprising a traversing unit formed with at least one traverse spanning over a testing field in which a circuit board to be tested can be arranged. The traverse has carriages arranged thereto, by means of which the test fingers can be displaced linearly. This traversing unit is characterized in that at least two independent linear guiding mechanisms are provided for guiding each carriage. Such a traversing unit can also be configured with two traverses spanning over the testing field, wherein one of the two traverses extends in one side and the other traverse extends the other side of the testing field. In this embodiment, the traversing unit forms an annular body, wherein the testing field extends through the opening of the annular body.

DE 44 41 347 A1 and U.S. Pat. No. 6,384,614 B2 disclose testing devices, by means of which a so-called four-wire sensing can be performed. In this case, the conductor paths are in each case double-contacted on their ends, wherein a current is fed by means of a pair of contacting elements and the involved voltage drop is measured by means of the other pair of contact elements. With such a four-wire sensing, small resistances of e.g. $1\mu\Omega$ to $100\Omega$ can be measured in a highly-precise manner. This is particularly expedient, if the conductor paths are used for the transmission of high-frequency signals or large currents.

WO 2006/133808 discloses a method for the testing of unequipped, large-surface circuit boards with a flying probe. The circuit boards are tested divided into individual segments, wherein conductor paths extending beyond a segment are tested by means of capacitive measuring of the end points located in the respective segment. Interruption of the conductor paths is determined if a measuring value differs from other capacitive measuring values of the same conductor path. The circuit board is displaced inside the flying probe in order to test individual segments of the circuit board.

In the testing of circuit boards, the testing of unequipped circuit boards and the testing of equipped circuit boards or assemblies is discriminated. Assemblies are circuit boards equipped with the corresponding electric components. Here, certain circuits are tested by applying function signals to certain contact points, wherein the response signals on the function signals are received at the other contact points. These testing methods are referred to as In-Circuit-Testing. Such an In-Circuit-Test is characterized such that only a few contact points must be contacted, but wherein often very complex signal functions are created. Unequipped circuit boards have their individual conductor paths tested, whether they have an interruption or whether they are short-circuited with another conductor path. This can be performed by means of an ohmic measurement. However, methods are also known in which interruptions and short-circuits are detected by means of capacitive measuring. In contrast to In-Circuit-Tests, all or almost all contact points of the conductor paths are contacted one or multiple times. In large-scale circuit boards, tens of thousands, if not more than one hundred thousand contact points, can be contacted. Furthermore, equipped circuit boards, in which the circuit board is equipped with a few individual electronic components, such as individual resistors, capacitors or transistors, are of increasing importance. Testing of partially-equipped circuit boards is similar to the testing of unequipped circuit boards, as the functional tests known from the In-Circuit test can usually not be carried out.

The object underlying the present invention is to provide a testing device as well as a method for testing circuit boards, in which the circuit board to be tested is scanned by several test fingers (flying probe), wherein a high through-put and a high flexibility are to be achieved in a simple manner.

Furthermore, the object underlying the invention is to create a testing device and a method for testing circuit boards, in which a circuit board to be tested is scanned with test fingers, wherein multiple circuit board testing points of a circuit board arranged in a row can also reliably be contacted even in case of a very dense arrangement.

One or more of the above objects are achieved by the subject matter of the independent claims. Advantageous embodiments are indicated in the respective sub-claims.

According to a first aspect of the invention, a testing device for the testing of circuit boards, in particular equipped or unequipped circuit boards, is provided, wherein the testing device comprises multiple test fingers formed for contacting circuit board testing points of a circuit board to be tested. The test fingers are in each case provided with a testing probe, wherein the test fingers are movable in such a way that they can contact any point in a predetermined test area with their testing probes. A shuttle is provided for transporting a circuit board between a receiving area and the test area.

This testing device is characterized in that the shuttle is formed of two sub-shuttles, which are in each case arranged in a plane to be displaceable along a displacement path between the receiving area and the test area, wherein the displacement paths extend in parallel and next to one another and the sub-shuttles each comprise a holding area, in which in each case one circuit board can be held by means of one or multiple holding elements.

A circuit board can be tested by means of such a sub-shuttle, wherein the circuit board located in the sub-shuttle is contacted by means of the test fingers. Simultaneously, the other sub-shuttle can be unloaded and loaded with a further circuit board. This circuit board can then be prepared in the sub-shuttle for another testing process, in which it is e.g. scanned by means of a camera to determine the position of the circuit board with respect to the sub-shuttle. This scan of the position of the circuit board is also often referred to as calibration.

Testing devices with test fingers, which are also referred to as flying probes, are very flexible, because they are basically suitable for testing circuit boards with any pattern of circuit board testing points. The individual test fingers scan the circuit board testing points sequentially. Compared to parallel testing devices, the general disadvantage of flying probes consists in that, due to the sequential scanning of the circuit board testing points, the testing speed is substantially lower. This is why the through-put is to be increased in testing fingers all the time. As there are two sub-shuttles provided in this testing device, one circuit board can be subjected to a testing process in the test area, whereas a further circuit board can be provided on the other sub-shuttle for the further testing process. This is why pause periods between two testing processes are very small. In small circuit boards, the time required for loading/unloading and possibly calibrating the circuit board is comparatively large compared to the time required for the actual testing process, which is why providing second sub-shuttles to smaller circuit boards considerably increases the through-put.

The sub-shuttles are preferably formed to be open on the side facing the respective other sub-shuttle, such that a circuit board can extent over both holding areas and be held by both sub-shuttles at the same time.

Since the displacement paths are arranged parallel and next to one another, these can be used together for the transport of a large circuit board. In a large circuit board, the time required for the testing process is substantially longer than the time required for loading/unloading. Due to the fact that the two sub-shuttles can be used together for transporting a large circuit board, the testing device allows testing of circuit boards of different sizes, wherein in the case of small circuit boards, the through-put can be increased considerably due to the double sub-shuttles. This testing device can therefore flexibly be used for circuit boards of different sizes and is also optimized in terms of through-put of smaller circuit boards.

A sub-shuttle can comprise two parallel holding arms, delimiting between them the holding area for receiving in each case one circuit board. The holding arms can be configured in a manner to be variable regarding the distance between them.

The two holding arms of a sub-shuttle can in each case be fastened to a carriage, which is displaceable along a shuttle track. The holding arms therefore form separate bodies.

The holding arms can also be an integral part of a frame having a C-shape in a top view, which is displaceable by means of merely one single carriage along a shuttle track.

If the holding arms are fastened each to a carriage, then the two carriages can be coupled to one another by means of a spacer means, by means of which the distance between the two holding arms can be adjusted. Such a spacer means can be a screw, for example, engaging into a spindle nut on a carriage, and which is mounted to be rotatable by means of a motor on the other carriage. Rotation of the screw allows adjusting the distance between the two carriages, and therefore the distance between the two holding arms.

One of the carriages of one of the sub-shuttles, which has a holding arm, can be formed with a drive device for moving the carriage along the shuttle track. The drive device can be a linear motor, for example.

The holding arms for holding a circuit board are in each case arranged on an edge of one of the holding arms, which face toward the respective other holding arm of the same sub-shuttle.

The holding arms can be clamping elements, which are spring-loaded to clamp a rigid circuit board between the holding elements of the two holding arms.

The holding elements can also be formed as grip/holding-elements gripping the edge of a circuit board. Such grip/holding elements are preferably used with flexible circuit boards, so that the circuit board gripped by the grip/holding-elements is applied with stress, such that the flexible circuit board is clamped planarly between holding arms.

The testing device can be provided with a loading/unloading device in the pick-up area for automated loading/unloading of the sub-shuttles with a circuit board. The displacement paths of the sub-shuttles are preferably formed in such a way, that the pick-up area is independent of the test area in such a way, that one sub-shuttle can be loaded/unloaded at the pick-up area and the other sub-shuttle is meanwhile located at the test area for the testing of a circuit board. This allows performing a testing process as well as loading/unloading one of the sub-shuttles and preparing it for a further testing process at the same time.

The receiving area can have a receiving element arranged below the sub-shuttles for receiving a circuit board. Such a receiving element can be formed as a horizontal, plane-surface plate, for example. The receiving element can also comprise support ledges running horizontally, however. An already-tested circuit board can be dropped on to the receiving element by means of the sub-shuttles, wherein a further circuit board to be tested can then be fed from above to the respective sub-shuttle or both sub-shuttles by means of a gripping arm. The sub-shuttle(s) is/are then moved towards the test area with the recently-fed circuit board, so that the already-tested circuit board located on the receiving element can be removed then with the gripping arm. This can reduce the interruption between two testing processes for loading/unloading of one or both sub-shuttle(s).

Similarly, it is also possible to receive an already-tested first circuit board by means of the gripping arm from the sub-shuttle in the receiving area and to place a second, not yet tested circuit board in the sub-shuttle(s) by means of the receiving element.

The receiving element can comprise multiple suction nozzles opening upwards, which are arranged in a manner as to be distributed in a horizontal plane. In particular, a flexible circuit board can be held by means of such suction nozzles, which is then preferably gripped by grip/holding elements. The suction nozzles can be formed in at least two ledges, which are preferably oriented in parallel to the guide rails.

The receiving element is preferably provided with a lifting means so that it is adjustable in height. By means of such a receiving element, a circuit board placed thereon can be lifted to the level of the sub-shuttles such that the sub-shuttles can grip the circuit board by means of the grip/holding elements.

The testing device can comprise a camera to scan a circuit board to be tested, which is held by a sub-shuttle. The camera can be displaceably arranged on a guide rail, which also has one or multiple test fingers arranged thereon in a displaceable manner. The camera can be arranged on a positioning device which holds a test finger. It is also possible for the camera to be arranged stationary, or to provide a rail irrespective of the guide rail for moving the camera. As an alternative, the camera can also be integrated in a loading/unloading device.

The holding elements on the holding arms can also be formed to be displaceable along the holding arms. A shuttle having such holding arms constitutes an individual inventive concept. The displaceability of the holding elements allows them to be arranged such as to not cover circuit board testing points of the circuit board.

According to another aspect of the invention, a testing device is provided for the testing of circuit boards, in particular for the testing of unequipped or partially-equipped circuit boards. The testing device comprises at least four test fingers provided for contacting of circuit board testing points on a side of the circuit board to be tested. The test fingers are in each case provided with a testing probe, wherein in each case two of the test fingers are displaceable along one of the traversing rails and the test fingers are rotatable about an axis oriented vertically to the test area, such that they can contact any point in a predetermined test area. The test fingers, which are displaceable along a common guide rail, in each case cover a strip-shaped scanning region, wherein the two scanning regions of the at least two pairs of test fingers overlap to some extent. The test area has holding elements provided for holding a circuit board to be tested. This testing device is characterized in that the holding elements are provided with a displacement device, by means of which they can be displaced together with a circuit board held by the holding means in the plane of the test area and transversely to the guide rails.

This testing device also allows contacting three or four closely-neighboring circuit board testing points arranged on a line running in parallel to the guide rail in a reliable manner simultaneously by means of at least one test finger, because these circuit board testing points can be arranged in the region in which both scanning areas overlap by displacing the circuit board. Such a contacting of three or more circuit board testing points is, for example, necessary in the testing of a MOSFET. Furthermore, four circuit board testing points are to be contacted at the same time if a four-wire sensing is to be performed. These circuit board testing points can also be arranged along a line. They can be reliably contacted using such a testing device, even if the four circuit board testing points arranged along a line extend in parallel to the guide rail.

The guide rails are preferably arranged to be stationary.

The guide rails can be arranged in close distance to one another as to form a narrow, strip-shaped test area, in which a high density of test fingers is arranged. The respective section to be tested can be brought into the test area by displacing the circuit board parallel to the guide rails.

The displacement device preferably comprises a path-measuring device for measuring the traveled displacement path. The path-measuring device is preferably formed with a spatial resolution of at least 10 µm or less, and in particular with a spatial resolution of at least 1 µm or less, or at least 0.1 µm or less.

The path-measuring device can comprise an optical scale and an optical sensor, which are arranged to be displaceable relative to one another, wherein the optical sensor scans the scale for detecting the displacement path.

According to another aspect of the present invention, the invention relates to a method for testing a circuit board, wherein a testing device explained above having two sub-shuttles is employed. A circuit board to be tested, which is located in a first sub-shuttle, is scanned by means of the test fingers in a testing process and, simultaneously, the other second sub-shuttle is unloaded and loaded with a further circuit board to be tested, wherein the second sub-shuttle is displaced to the test area then, in order to have the circuit board scanned there by means of the test fingers in a second testing process, when the first testing process is substantially completed.

This testing device thus allows testing two circuit boards subsequently and without interruption. It is even possible for the two testing processes to temporally overlap to some extent, if, for example, not all of the test fingers are required for testing the remaining circuit board testing points of the first circuit board, the second testing process can already be started with the non-required test fingers. This means that a testing process is essentially completed if a large proportion of the circuit board testing points to be scanned has already been scanned, so that not all test fingers are required any longer for testing this circuit board.

The circuit board in the second sub-shuttle can be detected by means of a camera before being subjected to the scan by means of the test fingers. In such an optical detection by means of a camera, the position of the circuit board can be determined with respect to the second sub-shuttle.

In another method for testing a circuit board, an above-described testing device which comprises a receiving element below the shuttle or the sub-shuttles, respectively, is used. After completion of a testing process, a circuit board is displaced to the receiving area by means of the shuttle or the sub-shuttles, respectively, is dropped on to the receiving element there, and a further, second circuit board is inserted into the holding area of the shuttle or of one or both sub-shuttles, respectively. The second circuit board can then be displaced to the test area, allowing the first circuit board located on the receiving element to become freely accessible and be lifted-off the receiving element and deposited outside of the receiving and test area.

Similarly, it is also possible to pick up an already tested first circuit board by means of the gripping arm from the sub-shuttle in the receiving area and to place a second, not-yet tested circuit board in the sub-shuttle(s) by means of the receiving element. When inserting the circuit board to be tested, the receiving element, which was previously fed a circuit board to be tested by means of the gripping arm, is lifted until the circuit board is at the level of the sub-shuttle (s). The sub-shuttle(s) can fix or grip the circuit board then. The receiving element is lowered again then, such that the sub-shuttle(s) can be freely displaced with the circuit board to be tested.

This method can be performed either with a testing device having two sub-shuttles, or with a testing device having merely one single shuttle. Due to the fact that the receiving element and the gripping arm allow a very quick exchange of two circuit boards on the sub-shuttles, the through-put of the testing device can be increased.

According to another aspect of the present invention, a method for testing a circuit board uses an above-explained testing device, which comprises at least four test fingers provided for contacting of circuit board testing points on one side of a circuit board to be tested, wherein in each case two of the test fingers are displaceable along a guide rail and the test fingers are rotatable about an axis oriented vertically with respect to the test area, such that they can contact any point in a predetermined test area by means of their testing probes, wherein the test fingers, which are displaceable along a common guide rail, in each case cover a strip-shaped scanning area, and the two scanning areas of the at least two pairs of test fingers overlap to some extent, and holding elements are provided for holding a circuit board to be tested, which are displaceable transversely to the guide rails by means of a displacement device. In this method, a circuit board to be tested is moved one or multiple times transversely to the guide rails to minimize movement of the test fingers. Here and in the following, a testing process refers to the process between the first and last contacting of the circuit board to be tested by means of one of the test fingers. Preferably, the circuit board is moved in a plurality of small steps in such a way, that the rotary movement of the test fingers is kept as small as possible, in order to be able to contact many circuit board testing points in a most rapid sequence.

Preferably, sections of the circuit board having a high density or number of circuit board testing points yet to be tested are brought into regions in which the scanning regions of the test fingers overlap. The test fingers can be scanned quickly and with a plurality of test fingers in the overlapping regions. The sections of the circuit boards having a high density or a high number of circuit board testing points yet to be tested changes as the testing process proceeds, as the already-scanned circuit board testing points, which are not scanned any longer, are not to be considered here.

In certain measurements, three or four circuit board testing points are to be contacted at the same time. These circuit board testing points are often arranged to closely neighbor one another, such that these circuit board testing points can not be contacted at the same time if located in a region which is only detected by two test fingers. Such measurements are e.g. required in four-wire sensing or when testing the ports of a MOSFET. The circuit board is therefore preferably positioned such that, for performing such a measurement, the circuit board testing points are located in the overlapping sections of the scanning areas, such that three or four circuit board testing points can be contacted at the same time using three or four test fingers. The circuit board is moved in such a way, that the individual groups of three or four circuit board testing points to be contacted at the same time are arranged in these sections.

In this method, no calibration is carried out between the individual movements of the circuit board by means of the sub-shuttles. Preferably, the shuttle or the sub-shuttles are calibrated beforehand in different positions with respect to the traverses. The inventors found that in contrast to conventional flying probes (e.g. WO 2006/133808 A1), in which the circuit boards to be tested can also be moved with respect to the traverses, it is possible to configure the movement mechanism precisely enough that re-calibration is not required after each movement of the shuttles or the circuit board to be tested. During calibration, preferably, a calibrating plate with a plurality of clearly-identified marks is inserted in the shuttle(s), and different positions of the calibrating plate and thus of the shuttle(s) are detected by the camera and correlated with the detected path data. As a result, by means of the detected path data, the current location of the circuit board to be tested with respect to the traverses can be provided with the precision required for contacting the circuit board test points, without which a further calibration is required.

Figure 2:
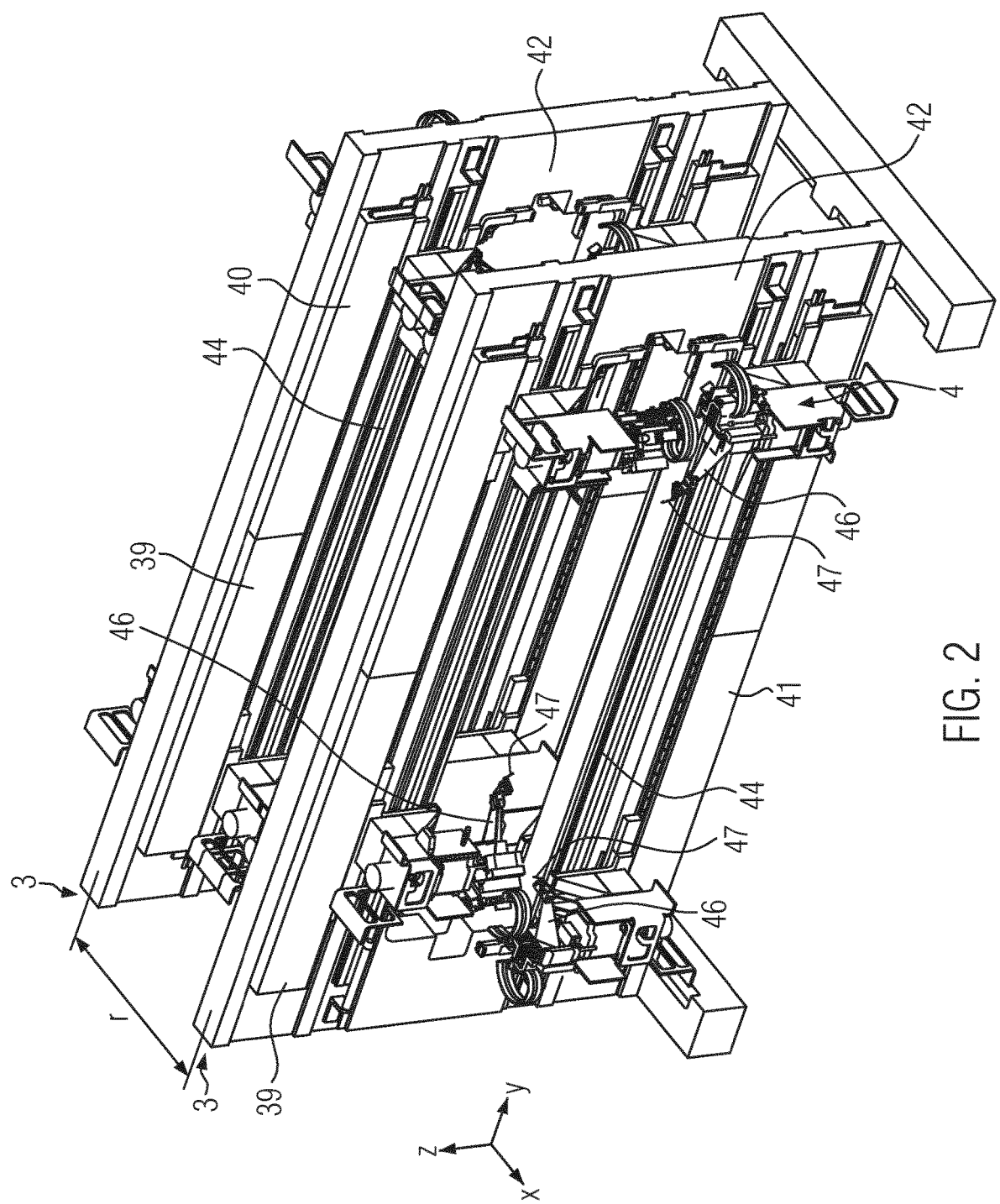
Figure 3:
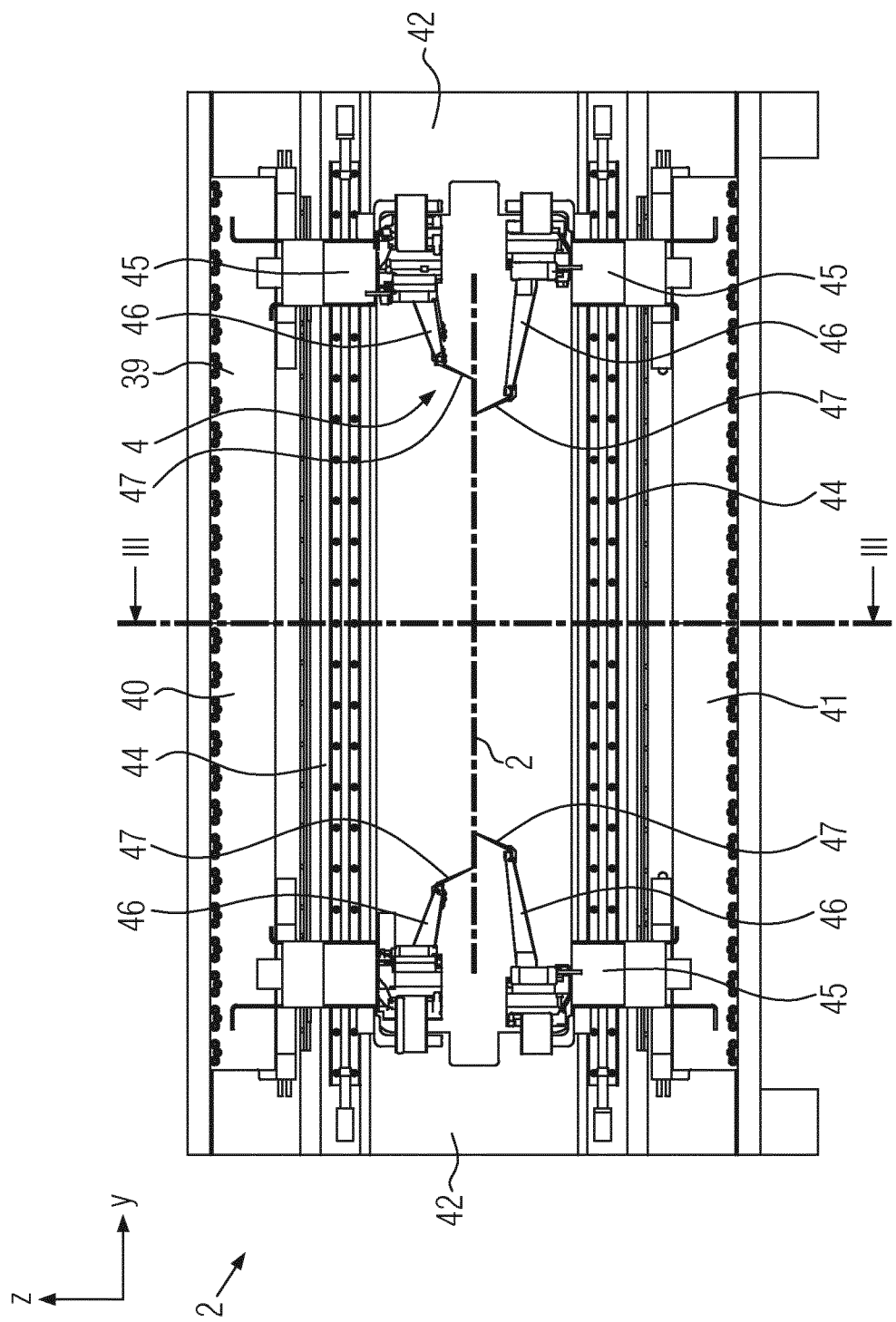
Figure 4:
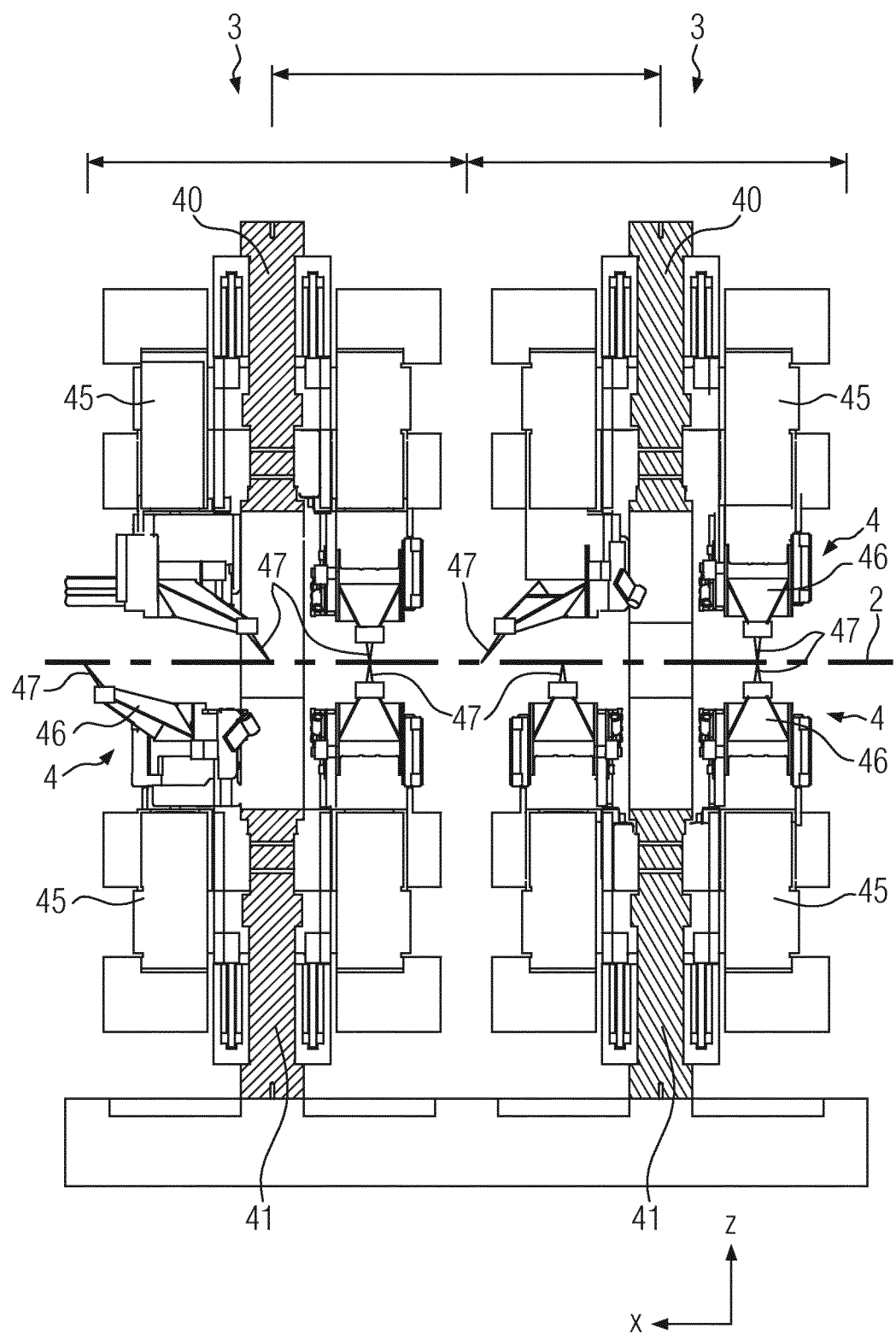
Figure 5:
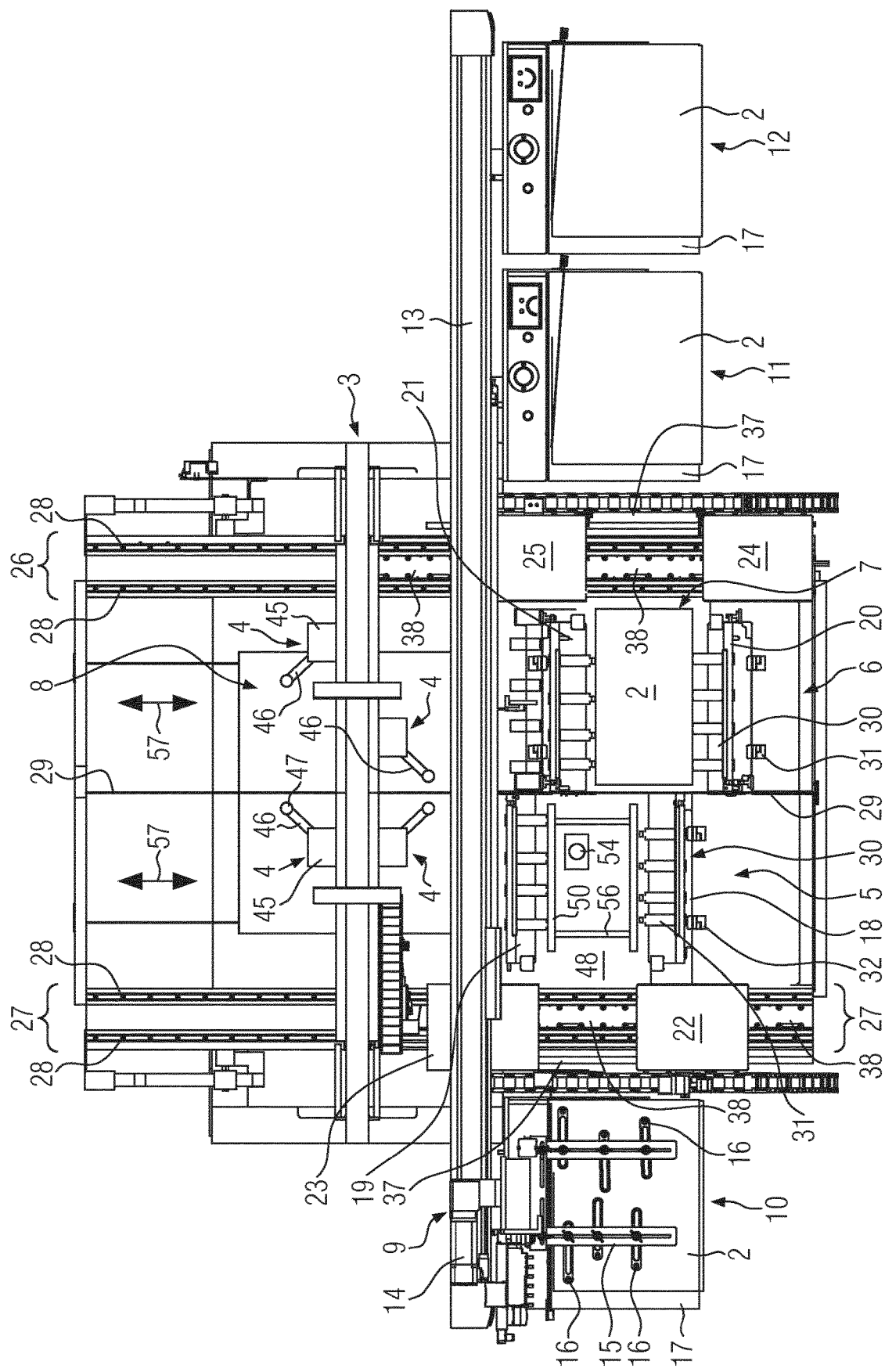
Figure 6:
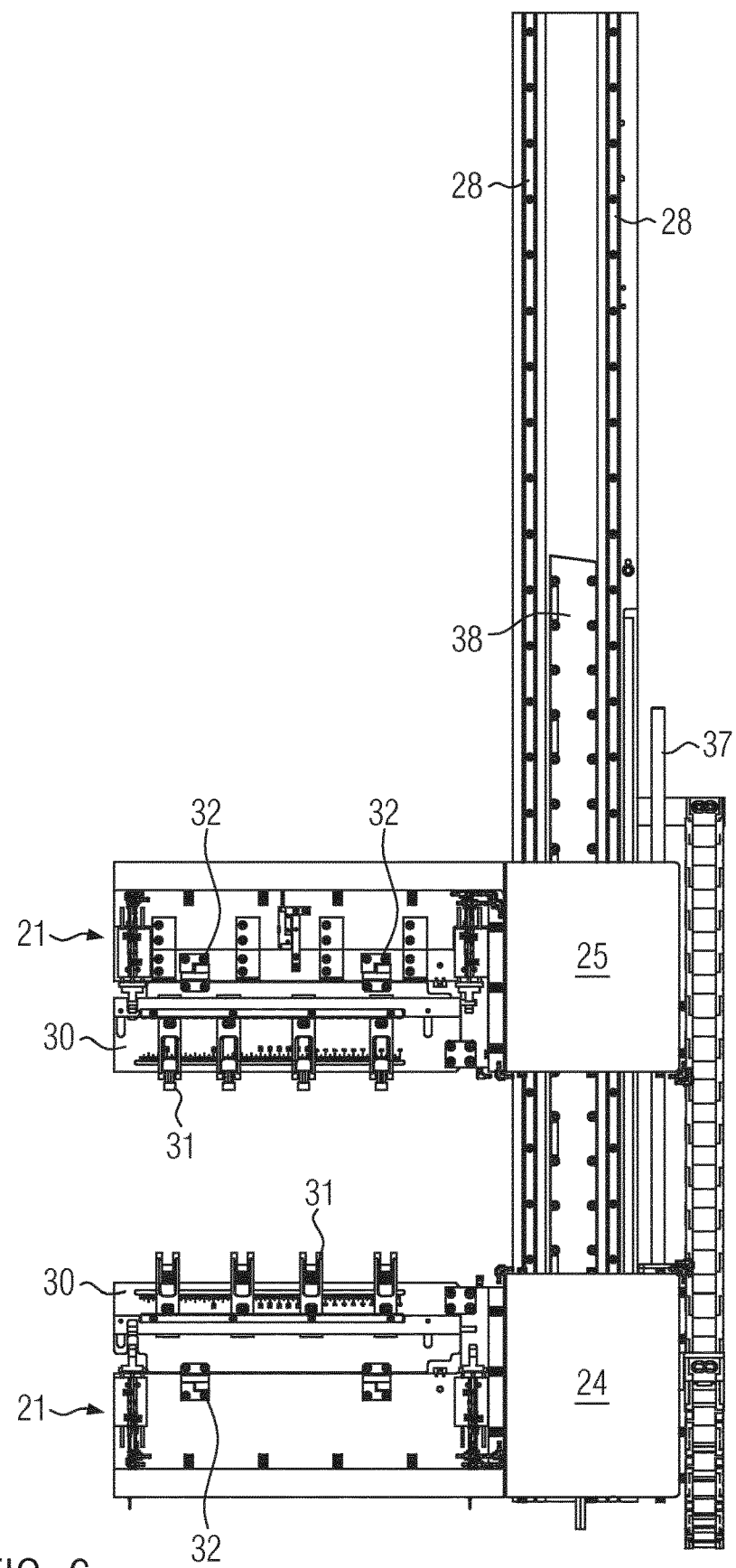
Figure 7A:
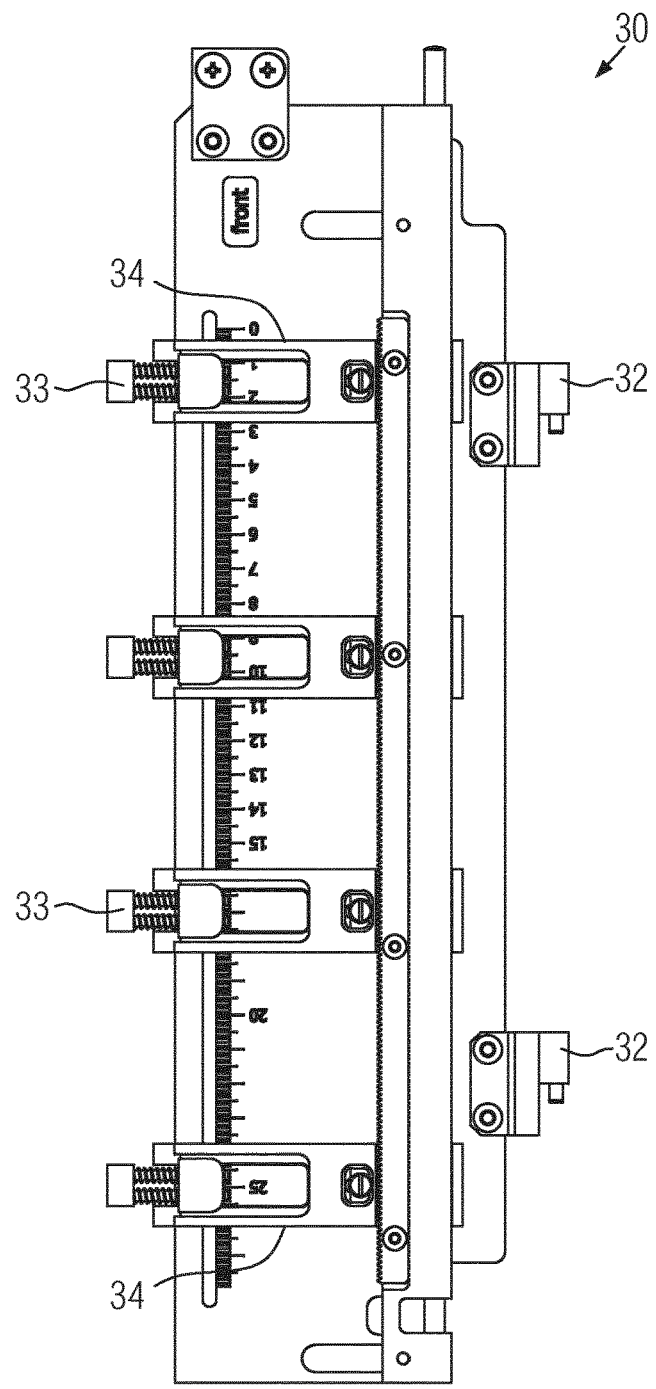
Figure 7B:
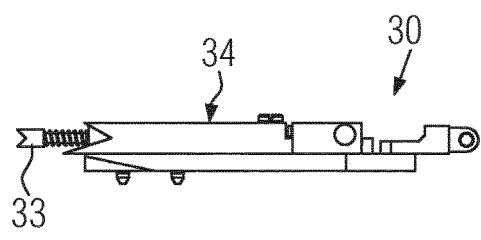
Figure 8A:
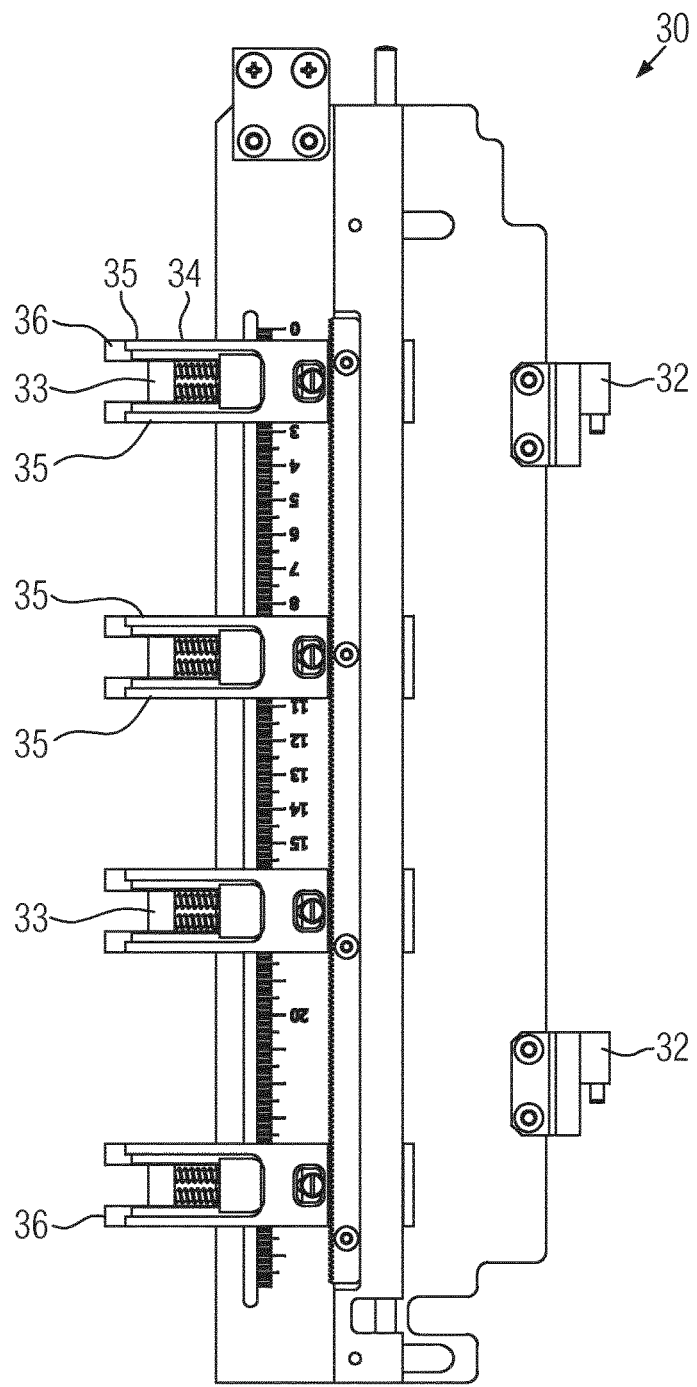
Figure 8B:
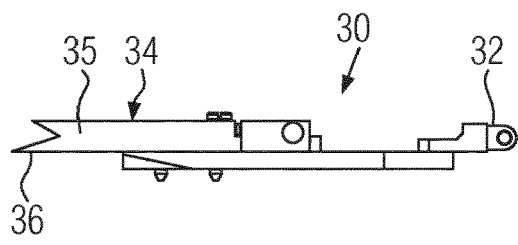
Figure 9A:
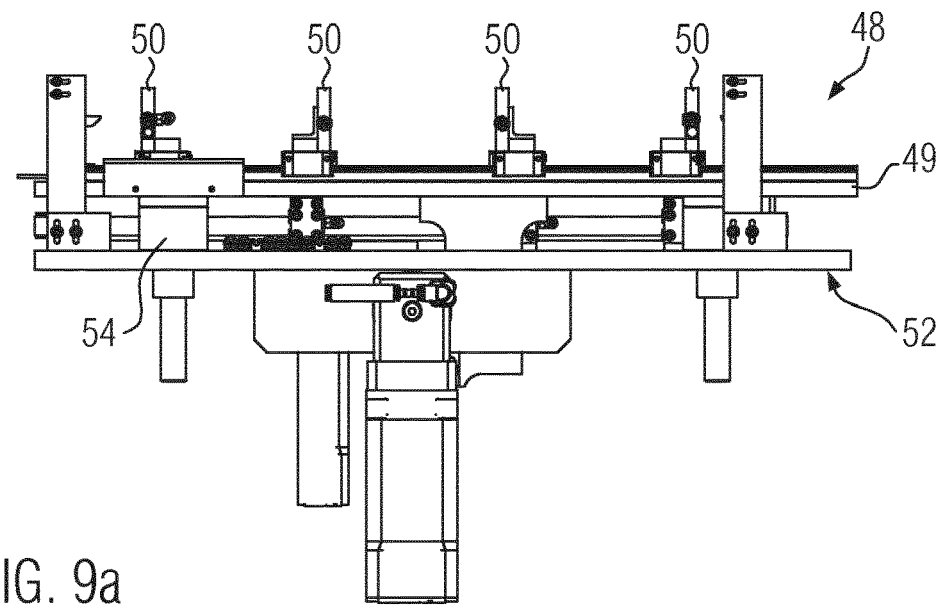
Figure 9B:
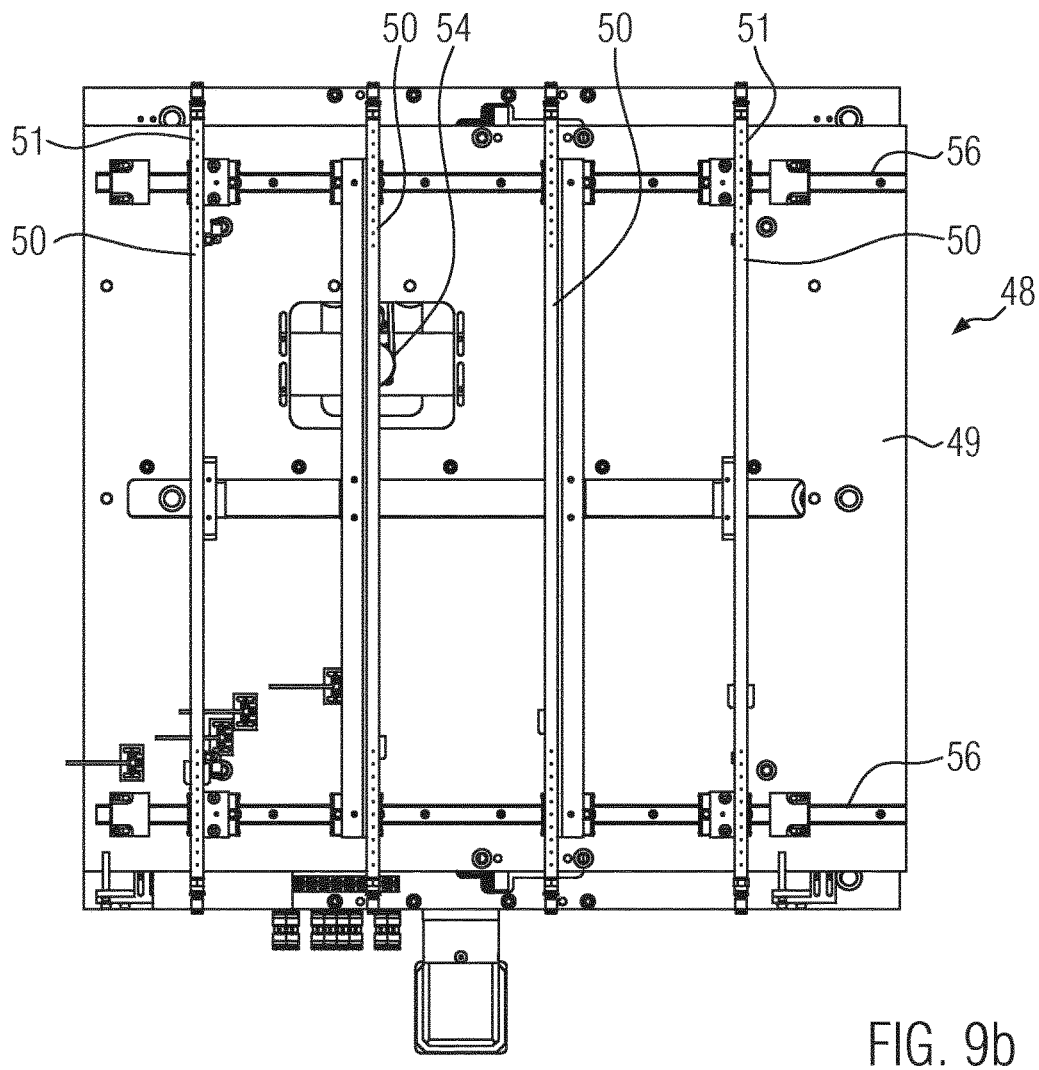
Figure 10:
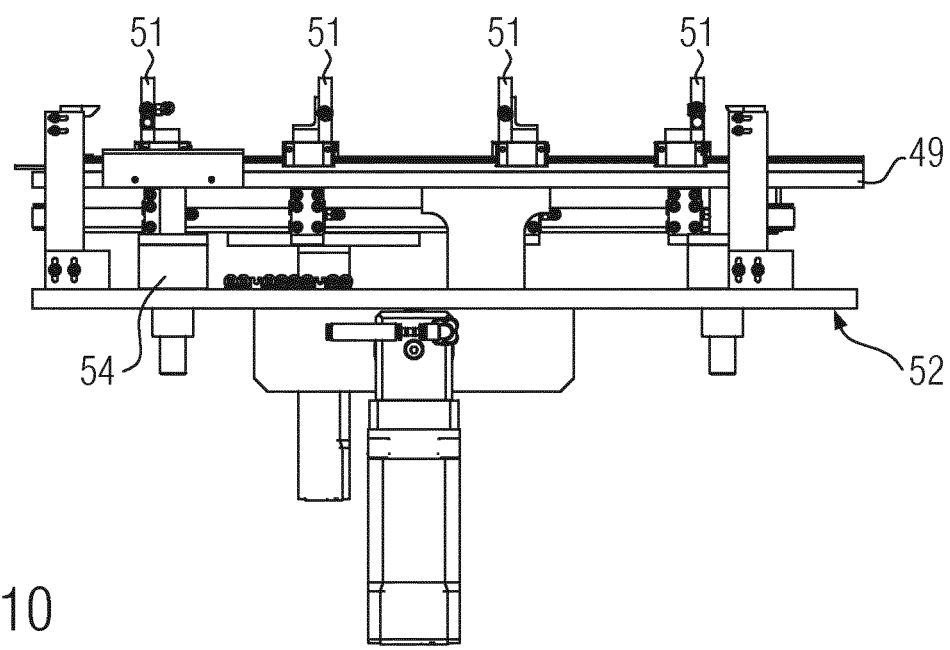

The invention is explained by way of example by means of the exemplary embodiments illustrated in the drawings. The drawings show in:

FIG. 1: a traversing unit for the testing device for the testing of circuit boards in a perspective view, FIG. 2: two traversing units for a testing device for the testing of circuit boards in a perspective view, FIG. 3: the traversing units of FIG. 2 in a front view, FIG. 4: the traversing units of FIGS. 2 and 3 in a sectional view, FIG. 5: a testing device for the testing of circuit boards having two sub-shuttles and a loading/unloading device in a top view, FIG. 6: a sub-shuttle of FIG. 5 in a top view together with a shuttle track, FIG. 7A, 7B: a holding means having multiple holding elements in a top view and in a lateral view in the gripping state;

FIG. 8A, 8B: the holding means having the holding elements of FIG. 7A, 7B in a pick-up state;

FIG. 9A, 9B: a receiving element in the form of a lifting table in a side view and in a top view in a lowered position, and FIG. 10: the lifting table of FIG. 9A, 9B in the lifted position.

A testing device 1 according to the invention for the testing of circuit boards 2 comprises a traversing unit 3, along which multiple test fingers 4 are displaceable, at least one shuttle, which is formed of two sub-shuttles 5, 6 in the present exemplary embodiment, by means of which the circuit boards to be tested can be displaced from a receiving area 7 to a test area 8 and back.

The testing device 1 comprises a loading/unloading device 9, by means of which circuit boards 2 can be transported from a supply stack 10 to the receiving area 7 and from the receiving area 7 to two stacks 11, 12.

The loading/unloading device 9 comprises a transport rail 13 extending along the supply stack 10, the receiving area 7 and the stacks 11, 12. The transport rail 13 has a transport carriage 14 arranged thereon in a displaceable manner, which can grip a circuit board by means of a gripping arm. In the present exemplary embodiment, suction cups 16 are provided on the gripping arm 15, by means of which a circuit board 2 can be gripped from above, moved, and placed down again.

The stacks 10, 11, 12 of circuit boards 2 are in each case arranged with the lowermost circuit board on a lifting device 17, said lifting device able to lift the respective stack 10, 11, 12 in such a way that the uppermost circuit board is located in a lift area of the gripping arms 15 of the transport carriage 14.

The sub-shuttles 5, 6 are formed of two holding arms 18, 19, 20, 21 each, which are in each case fastened to a carriage 22, 23, 24, 25. Carriages 22, 23 or 24, 25, respectively, of each one of the sub-shuttles 5, 6 are in each case arranged displaceably on a shuttle track means 26, 27. The two shuttle-track means 26, 27 each consist of two shuttle tracks 28 running in parallel, so that the carriages are on the one hand guided displaceably along the tracks 28 and, on the other hand, are secured against tilting about the longitudinal direction of the shuttle tracks 28. Holding arms 18-21 extend in each case horizontally from the carriages 22-25. Holding arms 18-21 are in each case arranged in parallel to the traversing unit 3 or transversely to the longitudinal direction of the shuttle tracks 28 or to the movement direction 57 of sub-shuttles 5, 6, respectively. Shuttle track means 26, 27 extend along the lateral edges of the receiving area 7 and of the test area 8, wherein the holding arms extend from the carriages 22-25 into the inner area between the two shuttle track means 26, 27. Thus, the shuttle track means define a displacement path in the movement direction 57 for the respective sub-shuttles 5, 6, which are arranged parallel and next to one another.

The free ends of the holding arms 18-21 distant from the carriages 22-25 extend approximately as far as to a center line 29 between the two carriage means 26, 27, wherein the free ends of the holding arms 18-21 are arranged at a slight distance from the free ends of the holding arms of the respective other sub-shuttle, even if they are located at the same position along the respective shuttle track means 26, 27. This ensures that the two sub-shuttles 5, 6 can be moved one past the other.

The holding arms 18-21 in each case comprise a holding means 30, having holding elements 31 arranged thereon for holding a circuit board. The holding means 30 and holding elements 31 are respectively arranged on the edge of the holding arms 18-21, which faces towards the other holding arm of the same sub-shuttle 5, 6.

The holding means 30 are in each case fastened to the holding arms 18-21 by means of two hinge joints 32. The holding means 30 can be folded upwards and, in the folded upwards state, be displaced axially with respect to the holding arms 18-21, releasing the hinge joints 32. This allows the exchange of the holding means 30 with other holding means.

The holding means 30 shown in FIGS. 5-8*b* are provided for holding rigid circuit boards. The holding elements 31 in each case comprise a horizontally-notched clamping jaw 33 (FIGS. 7*a*, 7*b*). The clamping jaws 33 are in each case enclosed by a pick-up fork 34, which in each case has two prongs 35 facing towards the respective other holding arm 18-21 of the same sub-shuttle 5, 6. The prongs 35 are in turn horizontally-notched (FIGS. 8*a*, 8*b*), wherein they comprise a protrusion 36 protruding forwards on their lower sides. To pick up a circuit board, the clamping jaws 33 are retracted into the region between the two prongs 35 of the respective pick-up fork 34 (FIGS. 8*a*, 8*b*), such that the prongs 35 laterally protrude on the clamping jaws 33 to some extent. Then, a circuit board 2 can be placed on the protrusions 36 of the prongs 35 and be clamped by approaching the holding arms 18-21 or 20, 21 respectively, and retracting the pick-up forks 34 between the clamping jaws 33. The holding means 30 comprise an actuating element (not shown), by means of which the pick-up forks 34 can be displaced together with respect to the clamping jaws 33 between the two positions shown in FIG. 7a, 7b or 8a, 8b, respectively.

The two carriages 22, 23 or 24, 25 of in each case one of the sub-shuttles 5, 6 are coupled to one another by means of a spacer means, by means of which the distance between the two carriages 22, 23 or 24, 25, respectively, or the respective holding arms 18, 19, respectively 20, 21, is adjustable. In the present exemplary embodiment, the spacer device includes a lead screw 37 (FIG. 5, 6), which is rotatably-mounted on the carriages 22, 24 in each case by means of a motor (not illustrated) and on the other carriages 23, 25 in each case engages through a screw nut (not illustrated) arranged in a manner to be fixed in rotation. The spacing of the respective carriages or holding arms is thus adjusted by a rotation of the lead screw 37 by means of the respective motor.

The carriages 22, 24 each comprise a drive device for moving the respective sub-shuttles 5, 6 along the shuttle track means 26, 27. In the present exemplary embodiment, the drive devices are configured as linear motors, wherein magnetic elements 38 are arranged in the shuttle track means 26, 27 in the region between the shuttle tracks 28, which form the stator of the linear motor. In the scope of the invention, other drive devices, such as friction wheels or toothed gears, can be provided for driving the sub-shuttles 5, 6 along the shuttle track means 26, 27.

Sub-shuttles 5, 6 comprise a path-measuring device (not illustrated) by means of which the displacement path along the shuttle track means 26, 27 is measured. In the present exemplary embodiment, the path-measuring device is formed by an optical scale arranged on the shuttle track means 26, 27, and an optical sensor, which is in each case arranged on one of the carriages of the two sub-shuttles 5, 6, and scans the scale. Such a path-measuring device can achieve a spatial resolution of 10 μm or less. The path-measuring device is connected to a central control means (not illustrated).

The region between the shuttle track means 26, 27 forms a working area, in which the circuit boards 2 can be arranged and be displaced back and forth by means of the sub-shuttles 5, 6 in the movement direction 57 along two parallel displacement paths extending next to one another. The side of the working area having the receiving area 7 arranged thereon is referred to as the front side of the working area or of the testing device 1, and the side having the test area 8 arranged thereon is referred to as back side or rear side. Accordingly, the term "to(wards) the front)" is referred to as facing towards the front side, and "towards the rear/rearwards" as facing towards the rear side.

In the present exemplary embodiment, the drive devices each engage with the front carriage 22, 24. The front carriages 22, 24 each have the motor for rotating the lead screw 37. These drive devices or motors could similarly be arranged on the rear carriages 23, 25.

The traversing unit 3 comprises a frame 39, which comprises an upper crossbeam 40 and a lower crossbeam 41 and two vertical lateral crossbeams 42 (FIG. 1). The beams 40, 41, 42 enclose a through-opening 43. The beams 40, 41, 42 are formed of plate-shaped elements, such that the frame 39 forms a plate-shaped body with a through-opening 43.

The upper and lower crossbeams 40, 41 each have guide rails 44 running horizontally both on the front and the rear side, on which in each case two test fingers 4 are arranged displaceable along the guide rails 44. The test fingers 4 are in each case formed of a positioning element 45 supported on the guide rails 44, a test finger 46 supported pivotably on the positioning element 45 about a vertical axis, and a testing probe 47, which is arranged in one of the free ends of the test fingers 46. The circuit board testing points of a circuit board to be tested are contacted by means of the testing probes 47. The testing probes are configured as spring-loaded contact pins, for example.

The positioning elements 45 are displaced along the guide rails 44 by means of linear motors.

The shuttle track means 26, 27 extend on the lateral edges of the through-opening 43, wherein the shuttle track means 26, 27 are arranged perpendicular to the plane of the plate-shaped frame 39. The sub-shuttles 5, 6 can be positioned in the region of the trough-openings 43 then, in such a way, that they or a circuit board 2 held by them is/are arranged between the upper test fingers mounted displaceably on the upper crossbeam 40 and the lower test fingers, which are mounted displaceably on the lower crossbeam 41. The upper test fingers 4 and the lower test fingers 4 can in each case contact the circuit board held by the sub-shuttles 5, 6 with their testing probes 46 from below or from above.

The two test fingers 4, which are in each case arranged on a guide rail 44, cover a strip-shaped scanning region, in which they can contact any point with their testing probes 47. These strip-shaped scanning regions extend parallel to the plane of the frame 39 or of the guide rails 44. The scanning regions of the test fingers on the front side of the frame 39 and on the read side of the frame 39 overlap to some extent. In the overlapping section, the circuit board testing points can be contacted both by the test fingers of the front side and by the test fingers of the rear side. This applies equally for the upper test fingers and for the lower test fingers.

In the exemplary embodiment according to FIG. 1 and FIG. 5, a single traversing unit 3 is provided, which comprises a guide rail 44 with in each case two test fingers 4 on its front and rear side in each case on the upper crossbeam 40 and on the lower crossbeam 41. As a result, a total of eight test fingers 41 are arranged on the traversing unit 3.

The testing device 1 can also be formed having more than one traversing unit, e.g. having two or three traversing units. FIGS. 2-4 in each case show an arrangement with two traversing units.

The structure of these traversing units substantially corresponds to the structure of the traversing units, as described in the International Patent Application WO 2014/140029 A1, to which reference is made herein in its entirety. Such a traversing unit 3 is characterized by the fact that at least two linear guides or guide rails 44 for guiding in each case at least one test finger 4 are provided independently from one another.

This testing device 1 is different from conventional testing device in that during a testing process, while the circuit board testing points are subsequently scanned with test fingers 4, the circuit board to be tested is moved transversely to the traversing unit(s) by means of the sub-shuttles 5, 6. Because the position of the sub-shuttles 5, 6 and therefore the position of the circuit boards in the movement direction of the sub-shuttles is very precisely detected by means of the path measuring device, a large proportion of the relative movements between the circuit boards and the testing probes is effected by displacing the sub-shuttles. It is common in conventional testing devices for the circuit boards to be arranged and calibrated in a certain position in the testing device, and then all test fingers are moved. The test fingers can be moved in that they are displaced along a traverse and in that they are rotated about a vertical axis, wherein multiple traverses are provided in such conventional testing devices in order to completely cover a predetermined test area. There are also conventional testing devices, in which the traverses are moved per se. The present testing device 1 does not require to re-calibrate a circuit board after each movement of one of the sub-shuttles 5, 6, due to the precise path-measuring device. A calibration at the beginning of the testing process is sufficient, and the circuit board can then be moved by means of the sub-shuttles for a desired number of times. This achieves a further degree of freedom besides the movement of the test fingers along the guide rails of the traversing units and the rotating of the test fingers.

As the sub-shuttles 5, 6, not the traversing units, are moved, the traversing units can be formed of a solid and stable steel body, on which the test fingers having long test fingers are arranged. Because the traversing units are stationary, there is basically no limitation regarding the weight of the traversing units. They are therefore very stable and can guide the test fingers very precisely. This allows the use of long test fingers, covering a substantially larger test area than with short test fingers. The test fingers have a length of at least 5 cm, which are measured as the distance between a tip of the testing probe and the rotational axis of the respective test finger. The length of the test fingers can also be greater and amount to at least 7 cm or at least 9 cm, for example.

This principle of displacing the circuit board by means of the shuttles during the testing of the same with respect to the traversing units, if multiple traversing units are provided, allows arranging these closely next to one another, so that a test area is provided with a high density of test fingers. The maximum distance of the traversing units amounts to no more than 600 nm, in particular no more than 500 nm or not more than 350 nm, and particularly preferably no more than 250 nm. The minimum distance of the traverses is preferably at least 80 nm, preferably at least 100 nm, and in particular at least 200 nm. The arm length of a test finger is at least 60%, preferably at least 70%, and in particular at least 75% of the distance between two neighboring traverses. The arm length is the distance of a contact tip of the testing probe of the test finger from the rotational axis of the test finger.

This allows very fast scanning of circuit boards with a high density of circuit board testing points. Although a closely-neighboring arrangement of the individual traversing units leads to a small test area compared to a testing device, in which the traversing units are arranged at a larger distance from one another, however, this is no disadvantage concerning the provided testing device, as the circuit board is displaced by means of the shuttles and can be re-positioned with respect to the traversing units. As a result, also regions of the circuit boards can be tested which were first located outside the test area of the test finger.

Two lifting tables 48 are arranged in the receiving area 7 (FIGS. 9A-10), which are in each case assigned to one of the two sub-shuttles 5, 6. The lifting tables have a horizontally-arranged lifting plate 49, on which multiple suction ledges 50 are arranged with suction holes or suction nozzles 51 opening upwards. The suction ledges 50 are arranged transversely to the movement direction of the sub-shuttles 5, 6.

The lifting plate 49 is supported from below by a frame 52, which comprises an electrically-driven lift cylinder for lifting and lowering the lifting plate 49. The frame 52 has a camera 54 fastened thereto, which is arranged to have its viewing direction upwards. The lifting plate 49 has a recess 55 in the region of the camera 54.

The suction ledges 50 are adjustable along rails 56 running transversely to the suction ledges 50. An adjustment device (not shown) is provided to that end, which comprises a transport belt that can selectively be coupled to the individual suction ledge 50, so that one or more suction ledges 50 can be changed in their positions by a coupling to the transport belt and a movement of the transport belt. The suction ledges 50 are connected to a vacuum pump, such that air can be suctioned through the suction holes 51.

These lifting tables 48 function as receiving elements for receiving circuit boards. They can be used as a short-term intermediate storage for an individual circuit board, as is explained in greater detail below. Because of the suction ledges 50, they are particularly suitable for picking up or receiving flexible circuit boards, to fix them in position by means of the suction holes 51 and to position them in such a way, by lifting the lifting plate 59, that the flexible circuit board can be arranged on its edge region by respective gripping elements, which can be provided on the holding arms 18-21 for holding flexible circuit boards. The edges of the flexible circuit boards, which protrude beyond the suction ledges 50, can be engaged by these gripping elements. Due to the fact that the suction ledges are adjustable to one another in terms of their distance, they can be adjusted to pick-up circuit boards of different sizes.

The operation of the testing device for the testing of circuit boards of a maximum size suitable for the holding area of one single sub-shuttle 5, 6 is explained below.

First, a first circuit board is lifted off the supply stack 10 by means of the gripping arm 15 of the loading/unloading device 9 and displaced to the receiving area 7 via one of the sub-shuttles 5.

The sub-shuttle 5 is positioned below the circuit board 2 in such a way, that the holding means 30 of holding arms 18, 19 are approximately aligned with the respective edges of the circuit board 2, wherein the distance of the holding arms 18, 19 is adjusted by means of the spacer means in such a way that the protrusions 36 of the prongs 35 which protrude on the clamping jaws 33 (according to FIGS. 8a, 8b) are slightly less spaced than is the width on the circuit board 2. The circuit board 2 is placed down onto the protrusions 36 of the prongs 35 then by means of the gripping arm 15, wherein the gripping arm then detaches its suction cups 16 and is moved back to the supply stack 10.

The circuit board 2 initially rests loosely on the protrusions 36 of prongs 35 of the pick-up forks 34. The holding arms 18, 19 are moved towards each other to some extent by means of the spacer means, such that the clamping jaws 33 are pushed against the edges of the circuit board 2. The pick-up forks 34 are retracted with respect to the clamping jaws 33. The circuit board 2 is therefore tightly clamped between the two holding arms 18, 19 and the sub-shuttle 5 can be displaced along the shuttle track means 26 in the movement direction 57 with the circuit board 2.

The circuit board is scanned on its lower side by means of the camera 54 integrated in the lifting table 48. Using the camera image captured in this way, which is transmitted to the central control device, the position of the circuit board in the sub-shuttle 5 is determined. As an option or as an alternative, a camera can be provided for scanning the upper side of the circuit board. This camera can be arranged on the transport rail 13, for example. The camera located on the transport rail 13 is preferably displaceable along the transport rail, so that circuit boards of both sub-shuttles can be detected by means of said camera.

After having determined the position of the circuit board 2 in the sub-shuttle 5, the circuit board is displaced into the test area 8. The test area is the strip-shaped region around the traversing unit 3, in which any point can be contacted by the testing probes 47 of the test fingers 4.

The circuit board 2 is then subjected to a testing process, wherein the individual circuit board testing points of the circuit boards are successively contacted with the testing probes 47 of the test fingers 4. In this case, the conductor paths of the circuit boards are tested for interruptions or short-circuits. The measurements can be done as ohmic or resistive measurements, wherein in each case two end points of a conductor path can be contacted with one test finger at the same time. It is also possible to measure the conductor paths in terms of capacitance, wherein merely a single test finger must then be in contact to the conductor path. A capacitive measurement is particularly expedient with long conductor paths.

The circuit board can extend beyond the test area 8 in the movement direction 57.

During the testing process, the circuit board can be displaced one or multiple times by means of the sub-shuttle 5 to position different sections of the circuit board in the test area 8 or in order to optimize movement of the test fingers, i.e. to keep them as small as possible.

Preferably, sections of the circuit board comprising a high density or a high number of circuit board testing points yet to be tested are brought into sections of the test area 8, in which scanning regions of test fingers of two different guide rails 44 overlap. This allows such sections having a high density or a high number of circuit board testing points yet to be tested to be contacted one after the other very quickly.

The individual movements of the circuit board yet to be tested do not require re-calibration, i.e. optical scanning, because the position of the circuit board with respect to the traversing unit 3 or to the test fingers 4 is precisely tracked by means of the path measuring device.

The displaceability of the circuit board with respect to the traversing unit 3 also allows reliable four-wire sensing for contacting the contact points of a MOSFET, as at least three or four circuit board testing points are to be contacted at the same time, which can also be arranged in a manner as to be closely adjacent to one another. Such a group of circuit board testing points, which are to be contacted simultaneously, can be brought into the section in which scanning regions of different groups of test fingers overlap by displacing the sub-shuttle 5, so that closely-neighboring circuit board testing points can be contacted with multiple test fingers at the same time. This also applies for circuit board testing points to be contacted at the same time that are approximately arranged in a line that extends in parallel to the traversing unit 3, which are often difficult to contact by means of conventional flying probes. These circuit board testing points, even if spaced wider to one another, can be brought into the overlapping region of two neighboring scanning regions by displacing the sub-shuttle.

During the testing process with the first circuit board 2 in the sub-shuttle 5, a further second circuit board 2 is inserted in the sub-shuttle 6 by means of the gripping arm 15. The circuit board inserted in the sub-shuttle 6 is in turn scanned with the camera 54, so that the position of the circuit board 2 in the sub-shuttle 6 is determined (calibration). The sub-shuttle 6, with the second circuit board, is displaced to the test area 8 then.

Once the testing process of the first circuit board is substantially completed, in such a way that at least not all test fingers are required for the testing of the first circuit board, then the testing process for the testing of the second circuit board starts, in which the test fingers no longer required for the testing of the first circuit board are displaced to the second circuit board and contact subsequent circuit testing points at this board.

After completion of the testing process of the first circuit board, said circuit board is displaced back to the receiving area 7 by means of the sub-shuttle 5. On the receiving area 7, the tested circuit board 2 is lifted off by the gripping arm 15 and displaced to one of the stacks 11, 12. Stack 11 is provided for defective circuit boards and stack 12 is provided for non-defective circuit boards.

The sub-shuttle 5 can be loaded with a further, third circuit board, while the second circuit board located in the sub-shuttle 6 is tested. The third circuit board is then in turn calibrated and is displaced to the test area 8.

Therefore, circuit boards can be tested one after the other with a short time interval at the test area 8.

In particular in small circuit boards, in which the testing process can be completed within short time, loading/unloading and calibrating of the circuit board causes a considerable delay and therefore a reduced through-put. This is avoided by means of the present testing device due to the alternating feeding of the test area 8 by means of the two sub-shuttles.

This device also allows testing circuit boards which are larger than the holding area of one of the two sub-shuttles 5, 6. To that end, the sub-shuttles are positioned in such a way that the respective front and rear holding arms 18, 20 or 19, 21 are aligned to one another. Therefore, a large, rectangular-shape circuit board can be inserted in the two sub-shuttles 5, 6 in such a way that it extends over both holding areas and can thus be held by both sub-shuttles 5, 6 at the same time. Sub-shuttles 5, 6 are thus used commonly as a single shuttle. If the circuit board is not of rectangular shape, it can nevertheless be received by both sub-shuttles 5, 6, wherein the respective holding arms are not arranged in a manner to be aligned to each other.

A large circuit board is then moved to the test area 8 by displacing the two sub-shuttles.

The large circuit board is likewise subjected to a testing process, as described above by means of small circuit boards, wherein during the testing process, the large circuit board can also be displaced relative to the traversing unit 3. Such a large circuit board also allows performing four-wire sensing or contacting other groups of circuit board testing points at the same time, even if located close to one another or arranged along a line transverse to the movement direction 57. If the testing process of the large circuit board is completed, the large circuit board is displaced towards the receiving area 7 by means of the sub-shuttles 5, 6. The large circuit board is placed down on to lifting tables 48 in the receiving area 7 then. Another circuit board can already be made available over the receiving area 7 by the gripping arm 17. It is then lowered by the gripping arm, such that it can be received by the sub-shuttles 5, 6 and, in turn, be displaced towards the test area 8.

Due to displacement of the sub-shuttles 5, 6 towards the test area, the circuit board is located freely accessible on the lifting tables 48, so that it can be picked up by the gripping arm 15 and be displaced on to a stack 11, 12.

By placing the circuit board on to the lifting tables 48, the time required for loading/unloading the sub-shuttles 5, 6 can be considerably reduced compared to conventional methods.

This testing device allows both small and large circuit boards to be tested, wherein with small circuit boards, the through-put, due to the alternating feeding of the circuit board to the test area, can be considerably increased compared to conventional flying probes.

In addition, the adjustability of the distance of the holding arms with respect to one another allows testing circuit boards of different types in short sequence, wherein no re-fitting or re-arrangement of the testing device is required, but merely the distance of the holding arms relative to one another is altered. Moreover, large circuit boards transported by means of both sub-shuttles and small circuit boards transported by merely one sub-shuttle can be tested one after the other without re-arrangements.

This testing device is therefore also highly-flexible and in addition allows a high through-put in the testing of small circuit boards.

The invention has been explained above by means of an exemplary embodiment of a testing device with one single traversing unit 3. In the scope of the invention, also multiple traversing units can be provided, as shown in FIGS. 2 and 3, for example.

The above-explained exemplary embodiment has two sub-shuttles 5, 6 provided. Certain aspects of the invention, for example providing the lifting table 48 and the method enabled thereby for picking-up a circuit board after having tested the same and for feeding a further board to the shuttle from above can also be used with a testing device comprising merely one single shuttle.

In the exemplary embodiment explained above, the two sub-shuttles 5, 6 are movable completely independently one from the other, given that no circuit board is inserted which extends across the holding areas of both shuttles. It may be expedient to provide a coupling element that mechanically couples both sub-shuttles to one another if they are to commonly receive a circuit board.

In the exemplary embodiment explained above, the shuttles each comprise two holding arms, which arms are separate components, and which are displaced with one carriage on in each case one shuttle track means. Basically, it is also possible to provide a conventional frame instead of the two holding arms, which is merely held by one single carriage. The frame can be formed in such a way that it is formed approximately C-shaped in a top view, so that it is open in the direction towards the other sub-shuttle.

As a result, a large-surface circuit board can be inserted in two opposite C-shaped frames, just as with the two sub-shuttles explained above.

In the above exemplary embodiment, the circuit boards are held inside the sub-shuttles 5, 6 by means of holding elements 31, in such a way, that they can be freely accessed from both sides and that both sides of the circuit boards can be tested at the same time. However, there are also testing devices for testing only one side of the circuit board. A shuttle for testing only one side of circuit boards can comprise holding elements engaging on the lower side of the circuit boards, such as one or multiple suction cups.

The invention is explained above by means of an exemplary embodiment having traversing units which comprise at least two guide rails 44. It is also possible within the scope of the invention to provide the guide rails in a different manner than with such traversing units. The guide rails can e.g. be arranged on a separate traverse, respectively. Just as well, multiple guide rails can be fastened to a common plate. Preferably, a separate plate with in each case multiple guide rails is provided for the testing of each side of the circuit board to be tested. The guide rails are preferably arranged on the plate(s) equidistantly and in parallel. Such a plate can be a granite plate, for example.

All these embodiments have in common that the guide rails are arranged to be stationary.

The maximum distance of the guide rails is expediently no more than 300 mm, in particular no more than 250 mm or no more than 175 mm, and particularly preferably no more than 125 mm. The minimum distance of the guide rails is preferably at least 40 mm, in particular at least 50 mm, or at least 100 mm, respectively

| List of reference characters | |
|---|---|
| 1 | testing device |
| 2 | circuit board |
| 3 | traversing unit |
| 4 | test finger |
| 5 | sub-shuttle |
| 6 | sub-shuttle |
| 7 | receiving area |
| 8 | testing area |
| 9 | loading/unloading device |
| 10 | supply stack |
| 11 | stack |
| 12 | stack |
| 13 | transport rail |
| 14 | transport carriage |
| 15 | gripping arm |
| 16 | suction cup |
| 17 | lifting device |
| 18 | holding arm |
| 19 | holding arm |
| 20 | holding arm |
| 21 | holding arm |
| 22 | carriage |
| 23 | carriage |
| 24 | carriage |
| 25 | carriage |
| 26 | shuttle track means |
| 27 | shuttle track means |
| 28 | shuttle track |
| 29 | center line |
| 30 | holding means |
| 31 | holding element |
| 32 | hinge joint |
| 33 | clamping jaws |
| 34 | pick-up fork |
| 35 | prong |
| 36 | protrusion |
| 37 | lead screw |
| 38 | magnetic element |
| 39 | frame |
| 40 | upper cross beam |
| 41 | lower cross beam |
| 42 | cross beam |
| 43 | through-opening |
| 44 | guide rail |
| 45 | positioning element |
| 46 | test finger |
| 47 | testing probe |
| 48 | lifting table |
| 49 | lifting plate |
| 50 | suction bar |
| 51 | suction hole |
| 52 | frame |
| 53 | lifting cylinder |
| 54 | camera |
| 55 | recess |
| 56 | track |
| 57 | movement direction |

The invention claimed is:

1. A testing device for testing circuit boards, wherein the testing device comprises multiple test fingers configured for contacting circuit board testing points of a circuit board to be tested, and the test fingers are in each case provided with a testing probe, wherein the test fingers are movable in such a way that they can contact any point in a predetermined test area with their testing probes, and a shuttle is provided for transporting a circuit board between a receiving area and the test area, wherein the shuttle is formed of two sub-shuttles, which are each arranged in a plane displaceable along a displacement path between the receiving area and the test area, wherein the displacement paths extend in parallel and next to one another and the sub-shuttles each comprise a holding area, in which in each case one circuit board can be held by means of one or multiple holding elements; and wherein the sub-shuttles are formed to be open on the side facing the respective other sub-shuttle, such that a circuit board can extend over both holding areas and be held by both sub-shuttles at the same time.

2. A testing device for testing circuit boards, wherein the testing device comprises multiple test fingers configured for contacting circuit board testing points of a circuit board to be tested, and the test fingers are in each case provided with a testing probe, wherein the test fingers are movable in such a way that they can contact any point in a predetermined test area with their testing probes, and a shuttle is provided for transporting a circuit board between a receiving area and the test area, wherein the shuttle is formed of two sub-shuttles, which are each arranged in a plane displaceable along a displacement path between the receiving area and the test area, wherein the displacement paths extend in parallel and next to one another and the sub-shuttles each comprise a holding area, in which in each case one circuit board can be held by means of one or multiple holding elements; and wherein each sub-shuttle comprises two parallel holding arms, which delimit the holding area for receiving in each case one circuit board, wherein the two holding arms are configured to be variable regarding the distance to one another.

3. The testing device according to claim 2,
wherein the two holding arms of one of the sub-shuttles are in each case fastened to a carriage, which is displaceable along a shuttle track means.

4. The testing device according to claim 3,
further comprising two carriages, wherein the carriages are coupled to each other by means of a spacer, by means of which the distance between the two holding arms can be adjusted.

5. The testing device according to claim 3,
wherein at least one of the two carriages of one of the sub-shuttles is formed with a drive device for moving the carriage along the shuttle track means.

6. The testing device according to claim 2,
wherein the holding elements are in each case arranged on an edge of one of the holding arms, which face to the respective other holding arm of the same sub-shuttle.

7. A testing device for testing circuit boards, wherein the testing device comprises multiple test fingers configured for contacting circuit board testing points of a circuit board to be tested, and the test fingers are in each case provided with a testing probe, wherein the test fingers are movable in such a way that they can contact any point in a predetermined test area with their testing probes, and a shuttle is provided for transporting a circuit board between a receiving area and the test area, wherein the shuttle is formed of two sub-shuttles, which are each arranged in a plane displaceable along a displacement path between the receiving area and the test area, wherein the displacement paths extend in parallel and next to one another and the sub-shuttles each comprise a holding area, in which in each case one circuit board can be held by means of one or multiple holding elements; and wherein a loading/unloading device for automatically loading/unloading the sub-shuttles with the circuit board is provided in the receiving area, and the displacement path of the sub-shuttles is formed so long that the receiving area is independent from the test area in such a way, that a sub-shuttle can be loaded/unloaded at the receiving area and in that the other sub-shuttle is meanwhile located at the test area for testing a circuit board.

8. The testing device according to claim 7,
wherein a receiving element is located below the sub-shuttles at least in the receiving area to receive a circuit board.

9. The testing device according to claim 8,
wherein the receiving element comprises multiple suction nozzles opening upwards, which are arranged to be distributed in a horizontal plane.

10. A testing device for testing circuit boards, wherein the testing device comprises multiple test fingers configured for contacting circuit board testing points of a circuit board to be tested, and the test fingers are in each case provided with a testing probe, wherein the test fingers are movable in such a way that they can contact any point in a predetermined test area with their testing probes, and a shuttle is provided for transporting a circuit board between a receiving area and the test area, wherein the shuttle is formed of two sub-shuttles, which are each arranged in a plane displaceable along a displacement path between the receiving area and the test area, wherein the displacement paths extend in parallel and next to one another and the sub-shuttles each comprise a holding area, in which in each case one circuit board can be held by means of one or multiple holding elements;

wherein a receiving element is located below the sub-shuttles at least in the receiving area to receive a circuit board;

wherein the receiving element comprises multiple suction nozzles opening upwards, which are arranged to be distributed in a horizontal plane; and wherein the suction nozzles are formed in at least two ledges, which are oriented parallel to guide rails, on which the test fingers are mounted to be displaceable.

11. The testing device according to claim 10,
wherein the receiving element is provided with a lifting means so as to be adjustable in height.

12. The testing device according to claim 1,
wherein the testing device comprises a camera for scanning a circuit board to be tested, which is held by a sub-shuttle.

13. A shuttle for transporting a circuit board for a testing device according to claim 1, with two holding arms, on which holding elements are arranged in each case on an edge of one of the holding arms, which faces the respective other holding arm, wherein the holding elements are displaceable along the respective holding arm.

14. A method for testing a circuit board using a testing device, which comprises a shuttle for transporting a circuit board to be tested between a receiving area and a test area and test fingers for contacting testing points of circuit boards to be tested, each test finger comprising a testing probe, wherein the test fingers are movable such that the test fingers can contact points in a predetermined test area with the testing probes of the test fingers, the method comprising:

in a first testing process, scanning a first circuit board to be tested via the test fingers, the first circuit board being held in a holding area of a first sub-shuttle of the shuttle of the testing device via holding elements of the first sub-shuttle;

simultaneously to the first testing process, unloading a second sub-shuttle of the shuttle of the testing device and loading the second sub-shuttle with a second circuit board to be tested, wherein the second circuit board is held in a holding area of the second sub-shuttle via holding elements of the second sub-shuttle;

upon completion of the first testing process, displacing the second sub-shuttle along a displacement path toward the test area; and in a second testing process, scanning the second circuit board via the test fingers, wherein each of the first and second sub-shuttles are arranged in a plane displaceable along a displacement path between the receiving area and the test area, and the displacement path for the first and second sub-shuttles extend in parallel and next to one another.

15. The method according to claim 14, wherein the sub-shuttles are each formed to be open on a side facing the respective other sub-shuttle such that a circuit board can extend over both holding areas and be held by both sub-shuttles at the same time.

16. The method according to claim 14, further comprising detecting the second circuit board to be tested via a camera and determining a position of the second circuit board with respect to the second sub-shuttle before the second testing process.

17. The method according to claim 14, further comprising:

upon termination of the testing processes, the sub-shuttle holding a circuit board that was tested displacing the circuit board that was tested to the receiving area;

removing the circuit board that was tested from the sub-shuttle and depositing the circuit board that was tested outside of the receiving area and the test area via a receiving element for receiving a circuit board and/or a gripping arm of the testing device;

placing in the sub-shuttle a subsequent circuit board to be tested via the receiving element and/or the gripping arm; and the sub-shuttle displacing the subsequent circuit board to be tested to the test area.

\* \* \* \* \*